US009077369B1

(12) United States Patent
Tsang

(10) Patent No.: US 9,077,369 B1
(45) Date of Patent: Jul. 7, 2015

(54) DELTA-SIGMA MODULATOR HAVING MULTIPLE DYNAMIC ELEMENT MATCHING SHUFFLERS

(71) Applicant: MIXSEMI LIMITED, Sheungshui (CN)

(72) Inventor: Robin M. Tsang, Austin, TX (US)

(73) Assignee: MIXSEMI LIMITED, Hong Kong (HK)

( * ) Notice: Subject to any disclaimer, the term of this patent is extended or adjusted under 35 U.S.C. 154(b) by 0 days.

(21) Appl. No.: 14/159,635

(22) Filed: Jan. 21, 2014

(51) Int. Cl.
*H03M 3/02* (2006.01)
*H03M 3/00* (2006.01)
*H03M 1/06* (2006.01)

(52) U.S. Cl.
CPC .............. *H03M 3/338* (2013.01); *H03M 1/067* (2013.01)

(58) Field of Classification Search
CPC ................... H03M 1/0643–1/10651; H03M 1/066–1/0673; H03M 3/338; H03M 3/34
USPC .................. 341/143, 144, 158, 159
See application file for complete search history.

(56) References Cited

U.S. PATENT DOCUMENTS 6,346,898 B1 * 2/2002 Melanson ................ 341/143
6,816,103 B2 * 11/2004 Jonsson et al. .......... 341/160
7,227,491 B2 * 6/2007 Doerrer et al. ............ 341/158
7,576,671 B2 * 8/2009 Petilli et al. ............... 341/143
7,760,121 B2 * 7/2010 Lakdawala et al. ...... 341/153

OTHER PUBLICATIONS

Stubberud et al., An Analysis of Flash Dynamic Element Matching Analog to Digital Converters, IEEE, Aug. 2000, Proceedings of the 43rd IEEE Midwest Symposium on Circuits and Systems (vol. 2 ), pp. 684-687.*
Fogleman et al. A Dynamic Element Matching Technique for Reduced-Distortion Multibit Quantization in Delta-Sigma ADCs, IEEE Transactions on Circuits and Systems—II: Analog and Digital Signal Processing, vol. 48, No. 2, Feb. 2001, pp. 158-170.*

* cited by examiner

*Primary Examiner* — Howard Williams
(74) *Attorney, Agent, or Firm* — Anthony P. Ng; Russell Ng PLLC

(57) ABSTRACT

A data converter is disclosed. The data converter includes a loop-filter, a quantizer, an analog dynamic element matching (DEM) shuffler, a digital DEM shuffler and a feedback digital-to-analog converter. The loop-filter receives analog signals from an analog input. The quantizer then converts the filtered analog signals from the loop-filter to digital signals at a digital output. The analog DEM shuffler shuffles a set of analog threshold levels of the quantizer to yield a set of partially shuffled digital data at an output of the quantizer. The digital DEM shuffler shuffles the set of partially shuffled digital data from the output of the quantizer to yield a set of shuffled digital data. The feedback digital-to-analog converter converts the set of shuffled digital data to a set of analog data to be fed back to the loop-filter.

12 Claims, 10 Drawing Sheets

DELTA-SIGMA MODULATOR HAVING MULTIPLE DYNAMIC ELEMENT MATCHING SHUFFLERS

BACKGROUND OF THE INVENTION

1. Technical Field

The present invention relates to mixed-signal circuits in general, and in particular to Delta-Sigma modulators.

2. Description of Related Art

Delta-Sigma analog-to-digital converters (ADCs) are capable of shaping quantization noise spectrums in the frequency domain such that more quantization noise can be placed in out-of-band frequencies while less quantization noise will remain in the pass band of interest. Thus, Delta-Sigma ADCs are commonly known for their high-resolution properties.

A Delta-Sigma ADC includes a feedback path containing feedback signals to be subtracted by analog signals from an analog input in order to generate error signals for a loop-filter. Thus, the Delta-Sigma ADC also requires a feedback digital-to-analog converter (DAC) to convert digital signals to corresponding analog signals for the feedback path. Typically, multiple analog unit-elements, such as unit-sized capacitors or unit-sized current sources, are employed within the feedback DAC. Any mismatch in the analog unit-elements, however, can cause higher pass band noise or distortion of desired signals, which directly affects the overall performance of the Delta-Sigma ADC. In order to alleviate the analog unit-element mismatch sensitivity, a dynamic element matching (DEM) technique can be introduced to boost the Delta-Sigma ADC's noise and linearity performance within the pass band of interest.

DEM, which is typically implemented as a DEM algorithm in conjunction with a DEM shuffler, operates to shuffle analog unit-elements in a feedback DAC. For example, a DEM algorithm may use a feedback DAC's input samples to generate control signals for a DEM shuffler. The DEM shuffler then uses the control signals to shuffle the analog unit-elements within the feedback DAC. Generally speaking, a DEM algorithm aims to shape analog unit-element mismatch energy in the frequency domain so that most of the analog unit-element mismatch energy can be placed in out-of-band frequencies where the mismatch energy can be subsequently filtered out without affecting any desired signals in the pass band of interest. With lesser analog unit-element mismatch energy remaining in the pass band of interest, the noise floor or linearity of the Delta-Sigma ADC will no longer be limited by the feedback DAC's mismatch energy within the Delta-Sigma ADC.

A commonly employed DEM algorithm is the data weighted averaging (DWA) algorithm. The DWA algorithm uses analog unit-elements sequentially in a round-robin fashion, iterated based on the digital output value of a quantizer, such that each of the analog unit-elements is used exactly once before it is used again. In the frequency domain, the DWA algorithm basically applies a first-order high-pass filter to a feedback DAC's analog unit-element mismatch energy. For a low-pass Delta-Sigma ADC where the pass band of interest is around DC, applying a first-order high-pass filter to a feedback DAC's analog unit-element mismatch energy will move the analog unit-element mismatch energy away from the pass band of the low-pass Delta-Sigma ADC. As a result, a higher linearity and lower noise floor can be achieved in the pass band of the low-pass Delta-Sigma ADC.

SUMMARY OF THE INVENTION

In accordance with a preferred embodiment of the present invention, a data converter includes a loop-filter, a quantizer, an analog dynamic element matching (DEM) shuffler, a digital DEM shuffler and a feedback digital-to-analog converter. The loop-filter receives analog signals from an analog input. The quantizer then converts the filtered analog signals from the loop-filter to digital signals at a digital output. The analog DEM shuffler shuffles a set of analog threshold levels of the quantizer to yield a set of partially shuffled digital data at an output of the quantizer. The digital DEM shuffler shuffles the set of partially shuffled digital data from the output of the quantizer to yield a set of shuffled digital data. The feedback digital-to-analog converter converts the set of shuffled digital data to a set of analog data to be fed back to the loop-filter.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

In theory, both a dynamic element matching (DEM) shuffler and a DEM algorithm can affect the overall speed of an associated Delta-Sigma modulator. In practice, it is usually the speed of a DEM shuffler rather than a DEM algorithm that affects the overall speed of an associated Delta-Sigma modulator because the DEM algorithm can usually be executed during a non-critical part of the sampling period. Thus, a higher sampling rate can be achieved by reducing the latency of a DEM shuffler within a Delta-Sigma modulator.

Figure 1:
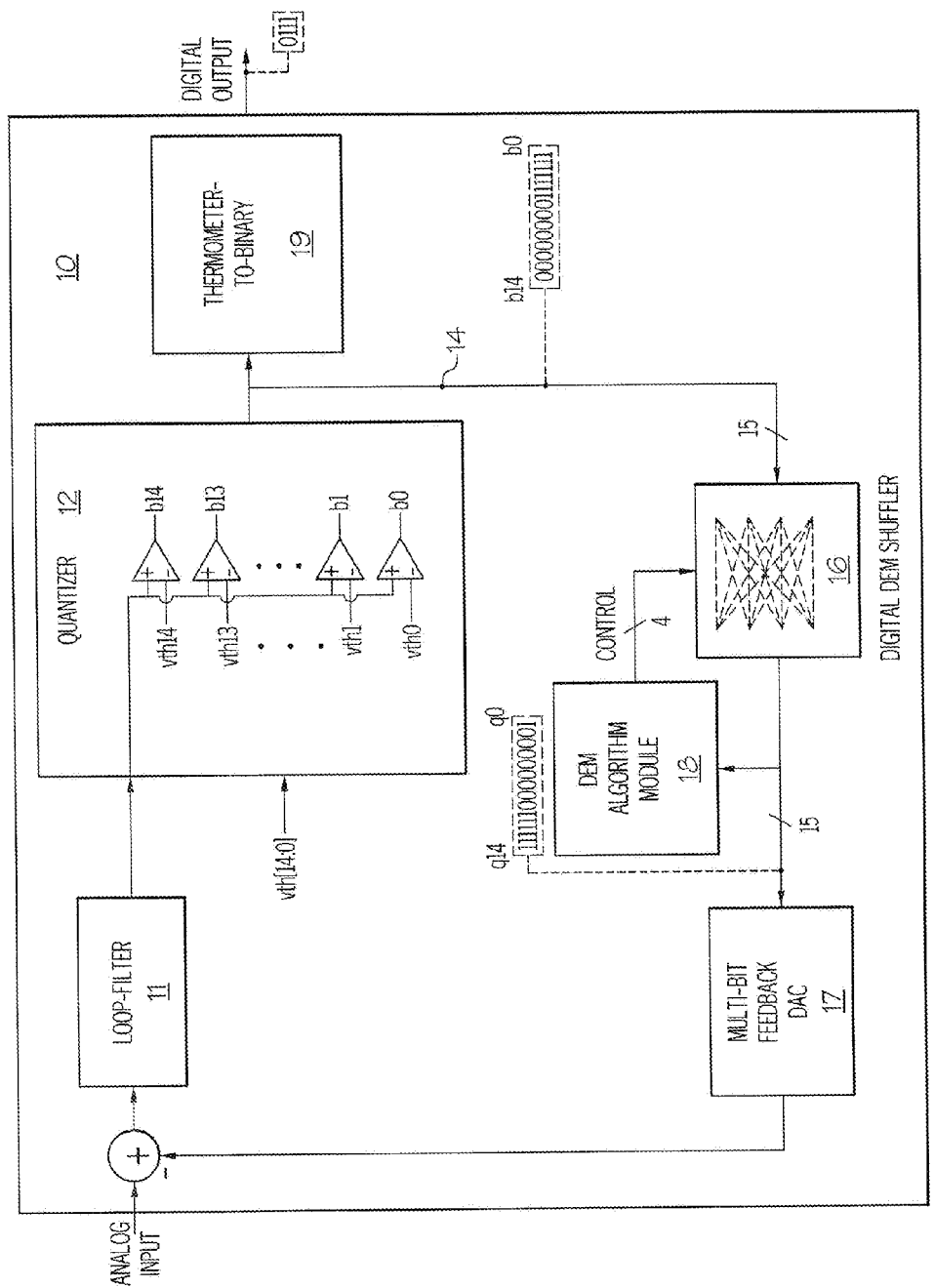
FIG. 1 is a block diagram of a Delta-Sigma modulator having a digital DEM shuffler.

Referring now to the drawings and in particular to FIG. 1, there is depicted a block diagram of a Delta-Sigma modulator having a digital DEM shuffler. As shown, a Delta-Sigma modulator 10 includes a digital DEM shuffler 16 located between an output of a quantizer 12 and an input of a feedback digital-to-analog converter (DAC) 17. The output of quantizer 12 and the input of feedback DAC 17 are both digital. With this configuration, the bits at the output of quantizer 12 are shuffled by digital DEM shuffler 16 before arriving at the input of feedback DAC 17. Each input bit of feedback DAC 17 controls exactly one analog unit-element within feedback DAC 17. By shuffling the output signals of quantizer 12, the corresponding analog unit-elements within feedback DAC 17 will be shuffled as well.

Figure 1A:
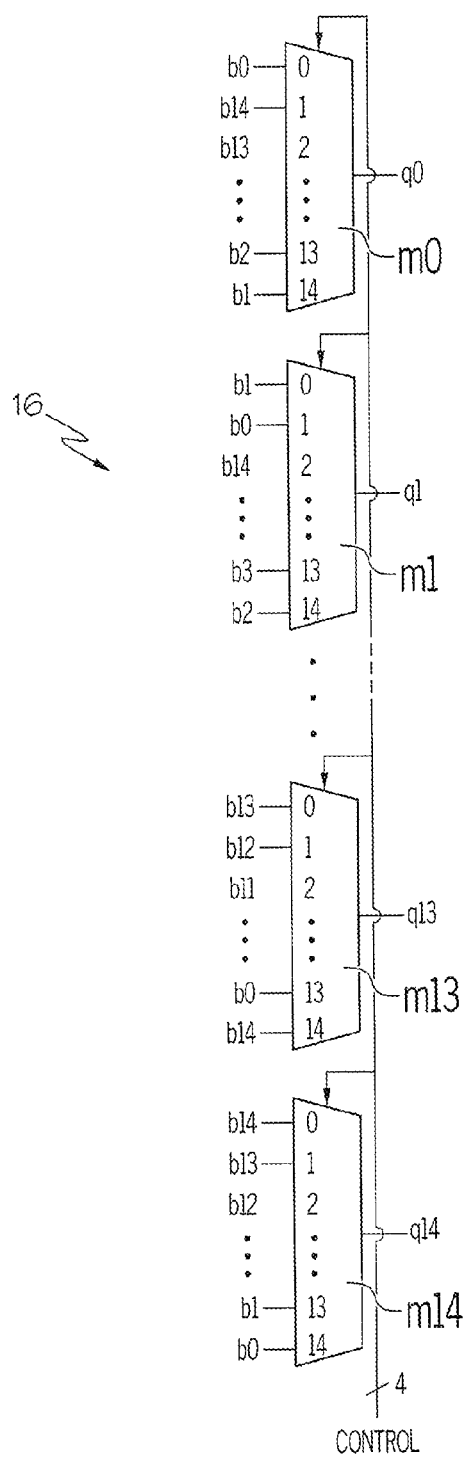
FIG. 1A is a block diagram of a digital DEM shuffler within the Delta-Sigma modulator from FIG. 1.

A detailed block diagram of digital DEM shuffler 16 is depicted in FIG. 1A. As shown, digital DEM shuffler 16 includes fifteen 15-way multiplexers m0-m14 to generate outputs q0-q14, respectively.

Table I shows cycle-by-cycle iterations of Delta-Sigma modulator 10. Based on the control signals from a DEM algorithm module 18, digital DEM shuffler 16 shuffles the outputs of quantizer 12 to generate inputs for feedback DAC 17. The value of the 4-bit binary control signal is exactly the number of bits rotated.

TABLE I

| cycle | DEM pointer | DSM output | Quantizer output (b14 ... b0) | DAC input (q14 ... q0) | control signals for digital DEM shuffler |
|---|---|---|---|---|---|
| 0 | 0  | 3  | 000000000000111 | 000000000000111 | 0000 |
| 1 | 3  | 6  | 000000000111111 | 000000111111000 | 0011 |
| 2 | 9  | 7  | 000000001111111 | 111111000000001 | 1001 |
| 3 | 1  | 12 | 000111111111111 | 001111111111110 | 0001 |
| 4 | 13 | 8  | 000000011111111 | 110000000111111 | 1101 |
| 5 | 6  | 4  | 000000000001111 | 000001111000000 | 0110 |

In Delta-Sigma modulator 10, quantizer 12 generates a 15-bit thermometer-coded data sample that equals to 000000001111111. The output of quantizer 12 is thermometer-coded because none of the threshold voltages are shuffled. Digital DEM shuffler 16 takes the data sample and rotates it by 9 bits, based on a set of control signals from DEM algorithm module 18, resulting in a bit pattern of 111111000000001 at an output of digital DEM shuffler 16. Feedback DAC 17 uses this shuffled bit pattern to enable corresponding analog unit-elements within feedback DAC 17, which in turn generate an analog output that is fed back to loop-filter 11. When a unit-element is said to be enabled, it means that a logic value "1" is driving a bit line controlling that unit-element. In a single-ended Delta-Sigma modulator, only unit-elements driven by a logic value 1 are switched into a circuit to provide feedback, while the rest of the unit-elements remain idle. But in a fully-differential Delta-Sigma modulator, both logic values, 1 and 0, will cause the associated unit-element to be switched into a circuit to provide feedback, albeit in opposite polarity.

A thermometer-to-binary converter 19 is used to convert the thermometer-coded data sample to a binary number equal to 0111 (decimal value 7). The bit-width of the control signals for digital DEM shuffler 16 is determined by the number of shuffling combinations that digital DEM shuffler 16 has. For the present example, since quantizer 12 is a 4-bit quantizer, and the DEM algorithm is DWA, the control signal is 4 bits wide. This is because when using the DWA algorithm, all 15 of the quantizer output bits are shifted in tandem, i.e., if one bit is shifted by 9 bits, then all bits are shifted by 9 bits, resulting in only 15 different possible shuffling combinations, which can be represented by 4 bits. If, on the other hand, a different DEM algorithm is chosen, the number of possible shuffling combinations may increase or decrease depending on the requirements of the DEM algorithm, possibly resulting in a different control signal bit-width.

Figure 1B:
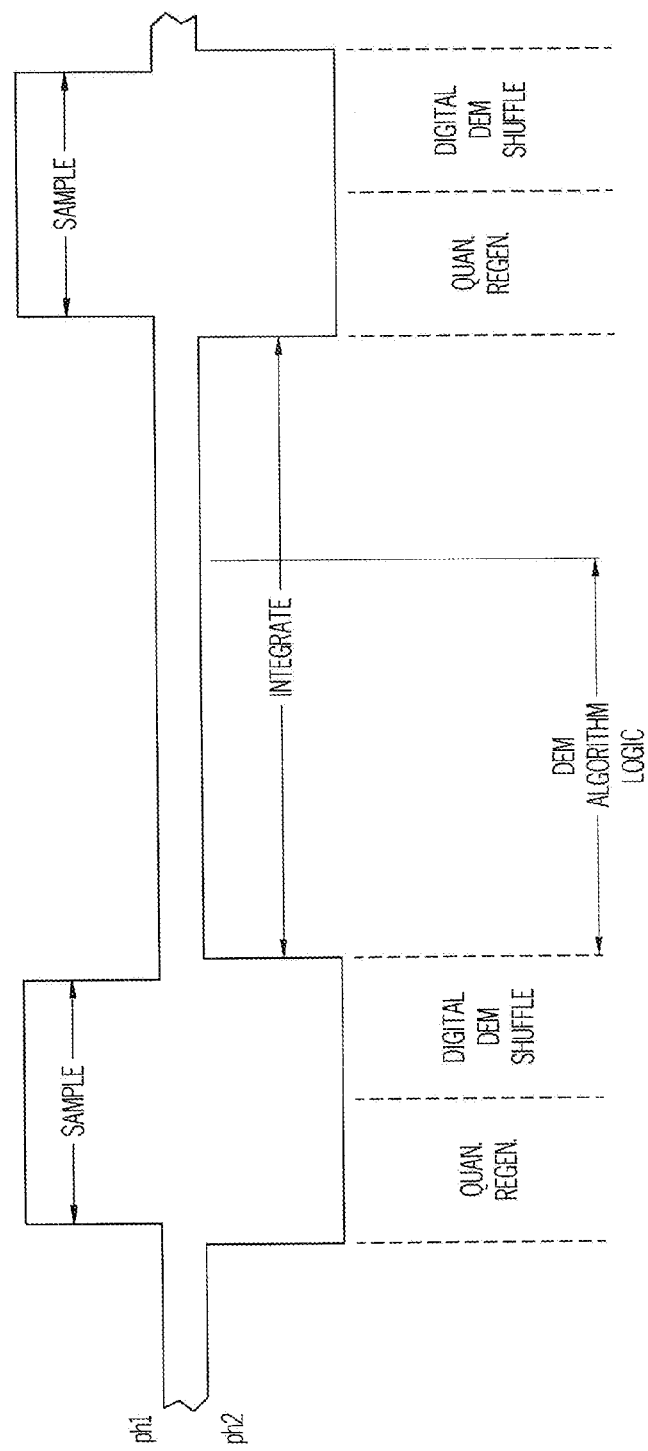
FIG. 1B is a timing diagram for the Delta-Sigma modulator from FIG. 1.

The timing diagram for Delta-Sigma modulator 10 is shown in FIG. 1B. For the present embodiment, Delta-Sigma modulator 10 is a discrete-time Delta-Sigma modulator having non-overlapped sampling and integrate phases. The sampling phase is associated with ph1 asserted high, and the integrate phase is associated with ph2 asserted high. Digital DEM shuffler 16 begins shuffling the outputs of quantizer 12 immediately after quantizer regeneration has been completed. It must finish shuffling before the rising edge of ph2, so that the quantized sample can be fed back to loop-filter 11 and integrated on time. Depending on the sampling rate and the complexity of digital DEM shuffler 16 (which is mainly dependent on quantizer resolution), digital DEM shuffler 16 may or may not be a bottleneck. In addition to shuffling, the output of digital DEM shuffler 16 is processed by DEM algorithm module 18, in order to generate DEM shuffler control signals for use in the following cycle. To meet timing requirements, control signals must be ready before the end of quantizer regeneration in the following cycle. This gives DEM algorithm module 18 almost one full cycle of computation time, and usually is not a bottleneck unless the DEM algorithm is unusually complex.

Figure 2:
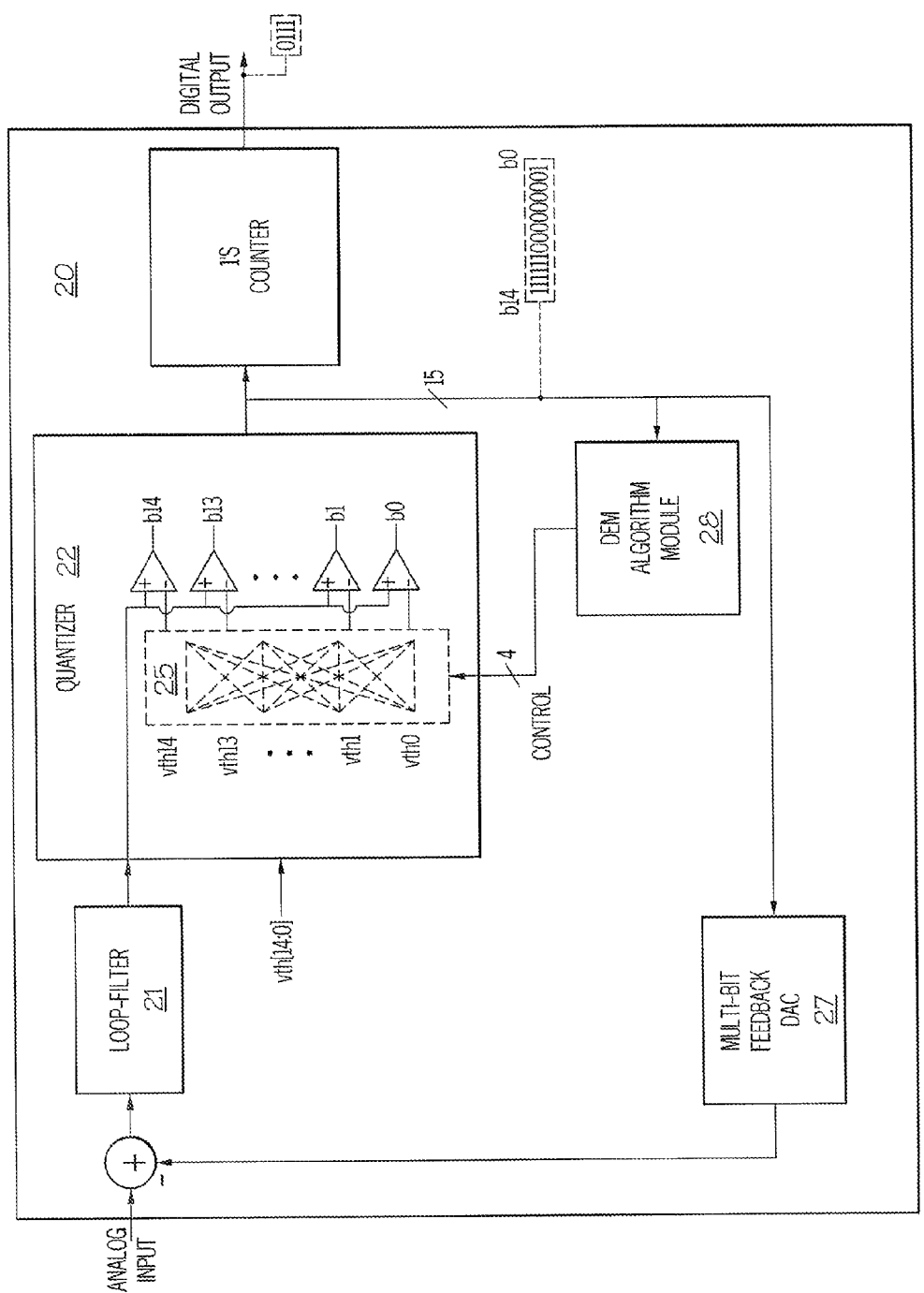
FIG. 2 is a block diagram of a Delta-Sigma modulator having an analog DEM shuffler.

With reference now to FIG. 2, there is depicted a block diagram of a Delta-Sigma modulator having an analog DEM shuffler. As shown, a Delta-Sigma modulator 20 includes an analog DEM shuffler 25 integrated within a quantizer 22. Analog DEM shuffler 25 pre-shuffles quantizer 22's analog threshold voltages associated with each of the internal comparators within quantizer 22 so that no shuffling is needed at the output of quantizer 22. Recall that a threshold voltage controls the tripping point of a comparator. With the output of a first comparator hardwired to an output bit of quantizer 22, swapping its threshold voltage with a second comparator at a second output bit is the same as swapping the two bits at the output, assuming that the two comparators are substantially identical. By extension, shuffling threshold voltages in quantizer 22 is the same as shuffling the output bits of quantizer 22 with a digital DEM shuffler. Thus, the output signals of quantizer 22 can be sent directly to feedback DAC 27, with the unit-elements shuffled according to how the threshold voltages are shuffled.

Figure 2A:
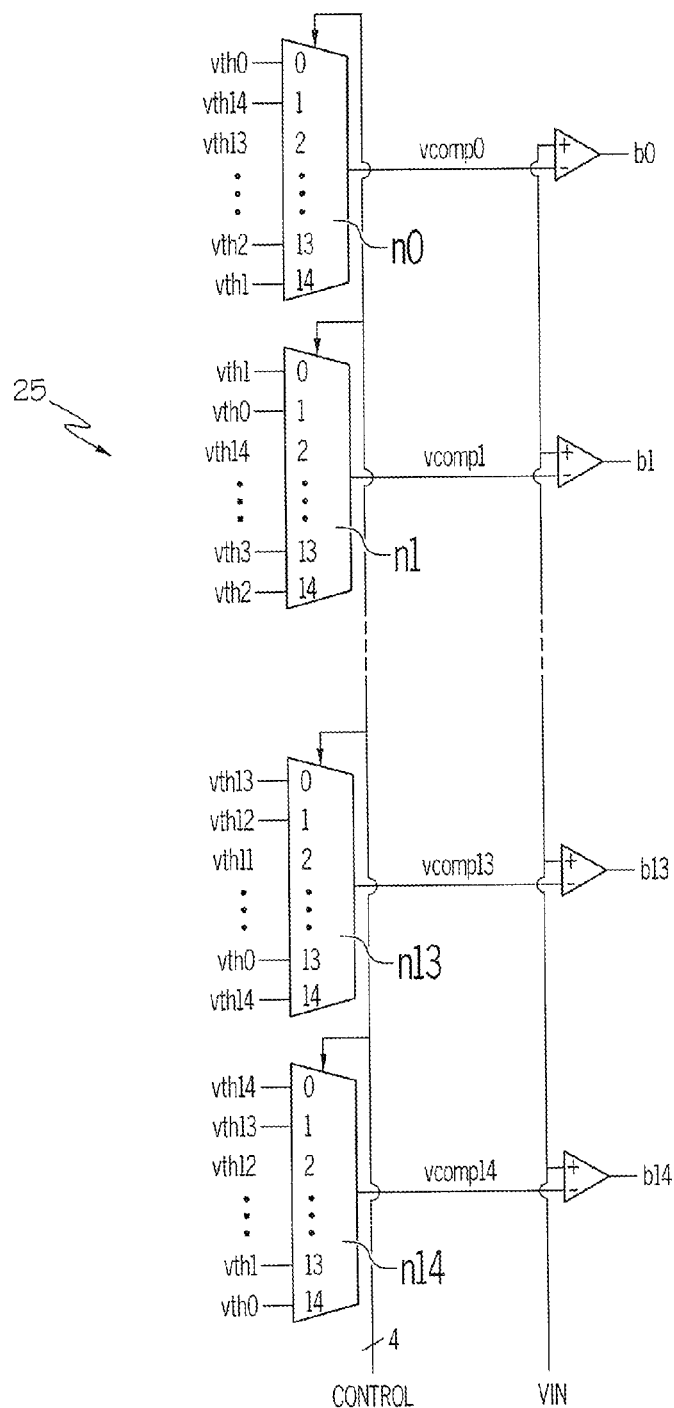
FIG. 2A is a block diagram of an analog DEM shuffler within the Delta-Sigma modulator from FIG. 2.

A detailed block diagram of analog DEM shuffler 25 is depicted in FIG. 2A. As shown, analog DEM shuffler 25 includes fifteen 15-way multiplexers n0-n14 to generate outputs b0-b14, respectively.

Table II shows cycle-by-cycle iterations of Delta-Sigma modulator 20. The value of the 4-bit binary control signal is exactly the number of bits rotated. As stated earlier, analog DEM shuffler 25 is integrated within quantizer 22; thus, the output of quantizer 22 is shuffled, and is the same as the input of feedback DAC 27. The control signals for analog DEM shuffler 25 are the same as the control signals for digital DEM shuffler 16 in FIG. 1 because both are 4-bit shufflers and both perform the same logical shuffle in each cycle.

TABLE II

| cycle | DEM pointer | DSM output | Quantizer output (b14...b0) | DAC input (b14...b0) | control signals for analog DEM shuffler |
|---|---|---|---|---|---|
| 0 | 0 | 3 | 000000000000111 | 000000000000111 | 0000 |
| 1 | 3 | 6 | 000000111111000 | 000000111111000 | 0011 |
| 2 | 9 | 7 | 111111000000001 | 111111000000001 | 1001 |
| 3 | 1 | 12 | 001111111111110 | 001111111111110 | 0001 |
| 4 | 13 | 8 | 110000000111111 | 110000000111111 | 1101 |
| 5 | 6 | 4 | 000001111000000 | 000001111000000 | 0110 |

In Delta-Sigma modulator 20, analog DEM shuffler 25 shuffles a set of threshold voltages based on a set of control signals from DEM algorithm module 28. Quantizer 22 uses the set of shuffled threshold voltages to generate a shuffled 15-bit unary data sample equal to 111111000000001. A 1's counter counts the number of 1's in the shuffled data sample, and generates a binary digital output for the Delta-Sigma modulator equal to 0111 (decimal value 7). Since the shuffling performed by analog DEM shuffler 25 is logically equivalent to the shuffling performed by digital DEM shuffler 16 from FIG. 1, the bit pattern at the output of quantizer 22 is exactly the same as the bit pattern at the input of feedback DAC 17 in FIG. 1, and the output of quantizer 22 is sent directly to feedback DAC 27. Feedback DAC 27 uses this shuffled data sample to enable the corresponding analog unit-elements within feedback DAC 27, which in turn generate an analog output that is fed back to a loop-filter 21. The bit-width of the set of control signals for analog DEM shuffler 25 is 4 bits wide for the same reasons as digital DEM shuffler 16 from FIG. 1.

When implemented correctly, digital DEM shuffler 16 or analog DEM shuffler 25 should produce the same exact shuffling sequence for a feedback DAC, given the same sequence of Delta-Sigma ADC output values. In other words, digital DEM shuffler 16 or analog DEM shuffler 25 can be selected independent of the DEM algorithm. The only difference is how the DEM algorithm is being realized in hardware.

Figure 2B:
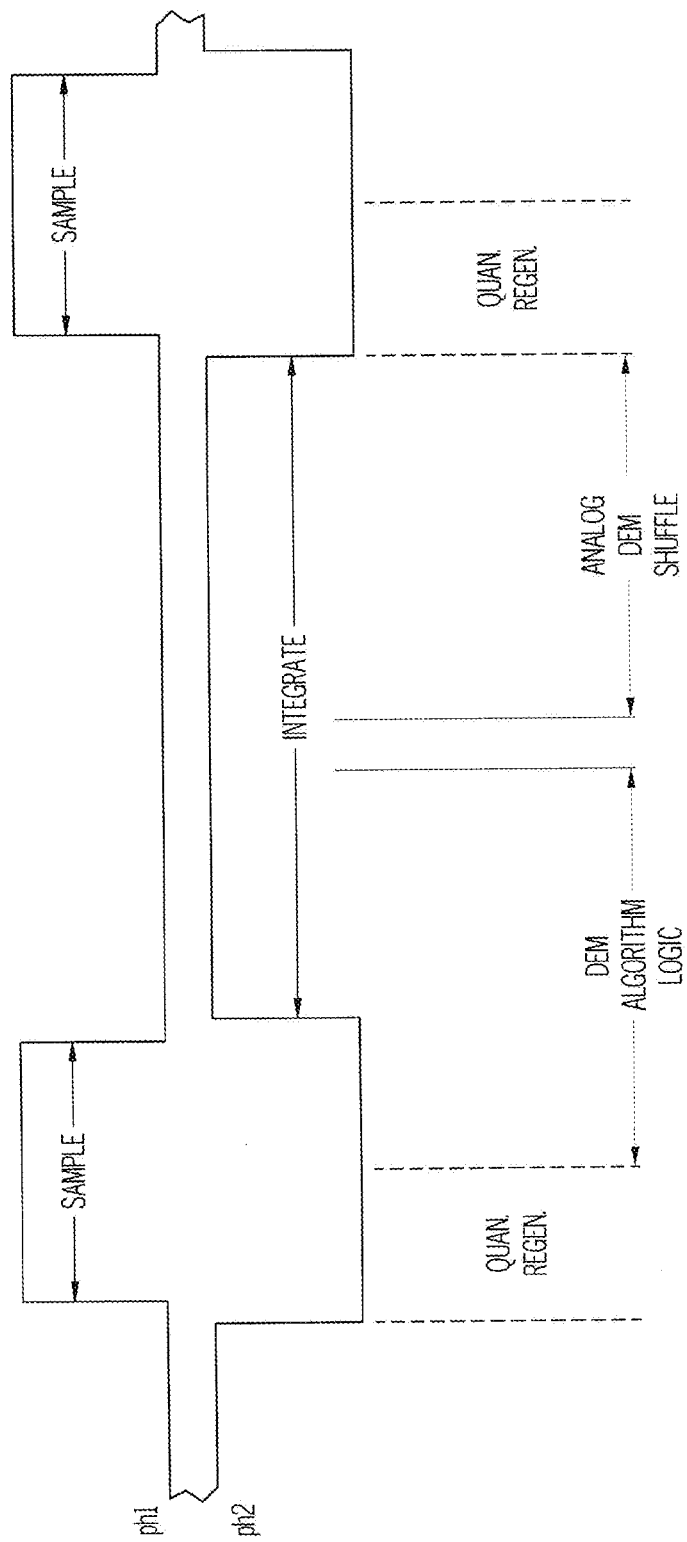
FIG. 2B is a timing diagram for the Delta-Sigma modulator from FIG. 2.

The timing diagram for Delta-Sigma modulator 20 is shown in FIG. 2B. Since threshold voltages must be shuffled before quantizer regeneration can begin, there is pressure on DEM algorithm module 28 to produce control signals sooner in this configuration. Control signals must be available to analog DEM shuffler 25 in order for it to shuffle threshold voltages for the comparators. In other words, the total propagation delay of quantizer regeneration, DEM algorithm computation, and analog DEM shuffling must be completed in less than one clock cycle. In practical situations, the computation time of DEM algorithm module 28 should be relatively short and the shuffler propagation delay relatively long in order for this configuration to be attractive. Otherwise, the digital DEM shuffler configuration may appear to be a better choice.

The problem with digital DEM shuffler 16 and/or analog DEM shuffler 25 is their complexity. Assume the DEM algorithm is DWA and the DEM shuffler is implemented with barrel shifters, the above-mentioned complexity grows by $2^{2M}$, where M is the resolution of the quantizer. For example, a DEM shuffler for a 4-bit quantizer (M=4) has a complexity of $2^{2 \times 4} = 2^8 = 256$. This is approximately correct, but to be exact, since a 4-bit quantizer can have a 15-bit unary output to represent 16 unique levels, the DEM shuffler for the 4-bit quantizer will have 15 input and output bits. Each of the 15 input bits needs to be assignable to any one of the 15 output bits. Thus, the complexity is 15×15=225, which is approximately 256. When M is larger than four, the complexity starts to become impractical for high-speed applications due to the associated exponential increase in parasitic capacitance in the DEM shuffler.

Figure 3:
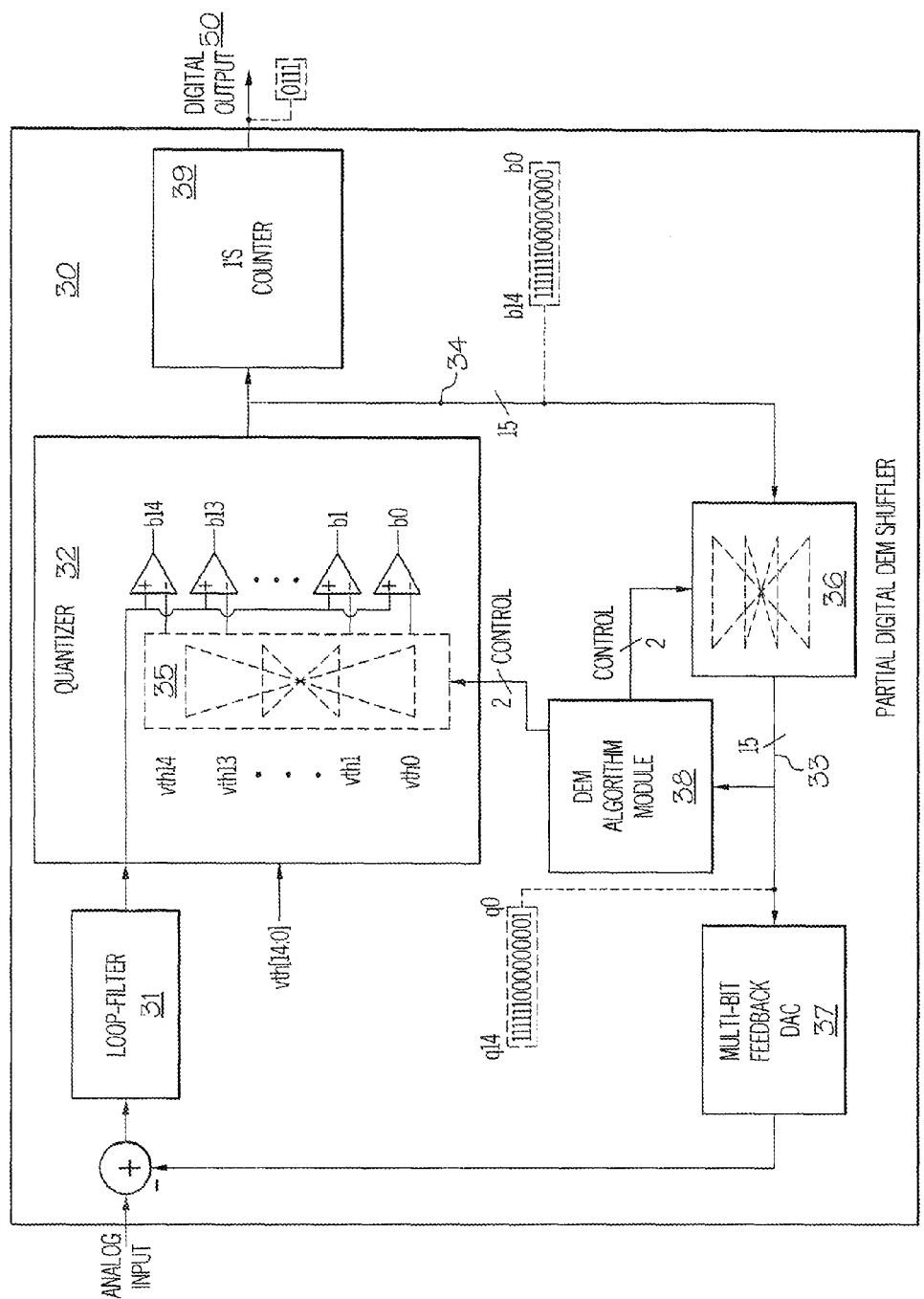
FIG. 3 is a block diagram of a Delta-Sigma modulator having analog and digital DEM shufflers.

Referring now to FIG. 3, there is depicted a block diagram of a Delta-Sigma modulator having analog and digital DEM shufflers, in accordance with a preferred embodiment of the present invention. As shown, a Delta-Sigma modulator 30 includes a loop-filter 31, a quantizer 32, an analog DEM shuffler 35, a digital DEM shuffler 36, a DEM algorithm module 38, a feedback DAC 37 and a digital one's counter 39. In the present embodiment, analog DEM shuffler 35 is shown to be integrated within quantizer 32, but it is understood by those skilled in the art that analog DEM shuffler 35 can be implemented as a separate unit.

Figure 3A:
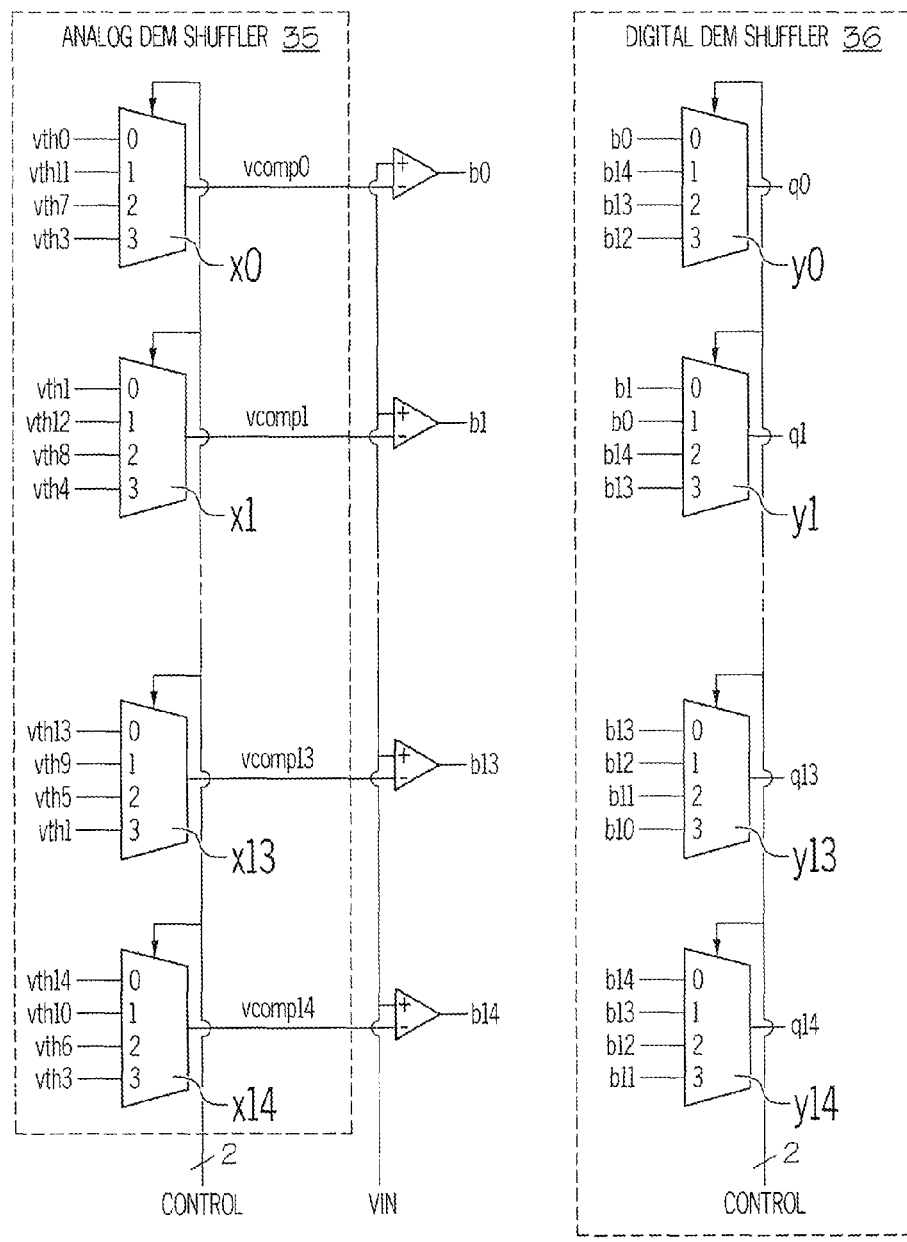
FIG. 3A is a block diagram of an analog DEM shuffler and a digital DEM shuffler within the Delta-Sigma modulator from FIG. 3.

Block diagrams of analog DEM shuffler 35 and digital DEM shuffler 36 are shown in FIG. 3A. As shown, analog DEM shuffler 35 includes fifteen 4-way multiplexers x0-x14 to provide outputs b0-b14, respectively. Similarly, digital DEM shuffler 36 includes fifteen 4-way multiplexers y0-y14 to provide outputs q0-q14, respectively.

Loop-filter 31 receives analog signals from an analog input and a feedback DAC 37. Quantizer 32 converts filtered analog signals generated by loop-filter 31 to digital signals at a digital output 34. DEM algorithm module 38 uses digital output 33 from digital DEM shuffler 36 to generate a first set of controls signals to control analog DEM shuffler 35 and a second set of control signals to control digital DEM shuffler 36. Analog DEM shuffler 35 shuffles a set of analog threshold voltages associated with quantizer 32 to yield a set of partially shuffled signals at digital output 34. Digital DEM shuffler 36 shuffles the set of partially shuffled digital signals from digital output 34 to yield a set of shuffled digital signals at digital output 33. Feedback DAC 37 converts the set of shuffled digital signals at digital output 33 to a set of analog signals to be fed back to loop-filter 31. Digital 1's counter 39 counts the number of 1's in a set of partially shuffled signals at digital output 34 to yield a set of binary-coded digital signals at digital output 50.

Analog DEM shuffler 35 and digital DEM shuffler 36 are two separate and independent DEM shufflers that work in concert to produce a desired set of DEM shuffling sequence for shuffling analog unit-elements within feedback DAC 37. As a result, each of DEM shufflers 35, 36 can be smaller than analog DEM shuffler 25 in FIG. 2 and digital DEM shuffler 16 in FIG. 1, respectively. With both DEM shufflers 35, 36 located within Delta-Sigma modulator 30, available time for shuffling is maximally utilized to achieve the highest ADC sampling rates. Each of DEM shufflers 35, 36 can shuffle data partially at two separate instances of time (before and after quantizer regeneration), and when combined, DEM shufflers 35, 36, as a pair, can realize the desired DEM shuffling operation. In other words, two separate but related partial shuffling operations, one performed by analog DEM shuffler 35 and the other performed by digital DEM shuffler 36, can produce, in aggregate, a shuffling sequence for shuffling analog unit-elements within feedback DAC 37. This shuffling sequence is logically equivalent to a shuffling sequence separately produced by either digital DEM shuffler 16 in FIG. 1 alone or analog DEM shuffler 25 in FIG. 2 alone.

Although the input of digital 1's counter 39 is shown to be taken from digital output 34, it will be understood by those skilled in the art that the digital input of digital 1's counter 39 can be taken from digital output 33 as well.

Table III shows cycle-by-cycle iterations of Delta-Sigma modulator 30. The output of quantizer 32 is partially shuffled by analog DEM shuffler 35. Rotation of analog DEM shuffler 35 is rounded down to the nearest multiple of 4, i.e., bits can only be rotated by 0, 4, 8 or 12, at the output of quantizer 32. The corresponding 2-bit binary control signals to rotate by 0, 4, 8 or 12 bits, are 00, 01, 10 and 11, respectively. After analog DEM shuffling, digital DEM shuffler 36 further rotates the output of quantizer 32 to complete the entire shuffling operation. The rotation of digital DEM shuffler 36 is restricted to between 0 and 3 bits. To rotate the bits by 0, 1, 2 and 3 bits, the 2-bit control signals for digital DEM shuffler 36 are 00, 01, 10 and 11, respectively.

For example, in cycle 2, the DEM pointer is 9. This means the first unit-element to be enabled is unit-element 9. The control signal of analog DEM shuffler 35 is equal to 10 in binary, corresponding to a rotation of 8 bits, which is 9 rounded down to the nearest multiple of 4. The residual is equal to one, so the control signal for digital DEM shuffler 36 is 01 in binary.

Analog DEM shuffler 35 partially shuffles a set of threshold voltages based on a set of control signals generated by DEM algorithm module 38. Quantizer 32 uses the set of partially shuffled threshold voltages to generate a partially shuffled 15-bit unary data sample equal to 111111100000000. The data sample is rotated by 8 bits instead of 9 due to partially shuffling of the threshold voltages, which will be explained shortly. A 1's counter 39 counts the number of 1's in the partially shuffled data sample, and generates a binary digital output for Delta-Sigma modulator 30 equal to 0111 (decimal value 7). Digital DEM shuffler 36 takes the partially shuffled data sample and further rotates it by one bit to complete the shuffling operation on the data sample, resulting in a 9-bit rotation. Subsequently, feedback DAC 37 uses the fully shuffled data sample, equal to 111111000000001, to enable the corresponding feedback DAC analog unit-elements, which in turn generate an analog output that is fed back to loop-filter 31.

Since Delta-Sigma modulator 30 includes analog DEM shuffler 35 and digital DEM shuffler 36, a decision needs to be made on how to partition the shuffling operation. The example in FIG. 3 shows that each of DEM shufflers 35, 36 is a 2-bit shuffler. This partitioning is implied by the two separate 2-bit control signals shown in FIG. 3, generated by DEM algorithm module 38, for both DEM shufflers 35, 36. Other methods of partitioning are possible, such as a 1-bit analog DEM shuffler paired with a 3-bit digital DEM shuffler, or vice versa. Exactly how to partition depends on the particular situation. Factors affecting the partition may include the resolution of a quantizer, topology of a Delta-Sigma modulator, discrete- or continuous-time Delta-Sigma modulator, type of shuffler, complexity of DEM algorithm, and process technology with respect to sampling rate.

In order for both DEM shufflers 35, 36 to work together properly, control signals to both DEM shufflers 35, 36 must be coordinated, and the internal configuration of both DEM shufflers 35, 36 must be known before designing DEM algorithm module 38. This is because a DEM shuffler that is only capable of shuffling partially means that some shuffling combinations in the DEM shuffler are absent. Nevertheless, it is these absent shuffling combinations together with their associated parasitic capacitance that make the partial shuffler fast. Which exact combinations are absent depends on how the analog and digital DEM shufflers are designed together. For example, in the embodiment of FIG. 3, the control signals of DEM shufflers 35, 36 are both 2 bits wide. This means that each threshold voltage can be assigned to no more than one out of 4 comparators, and each digital DEM shuffler 36 input bit can be assigned to no more than one out of 4 output bits. In order to cover all the shuffling combinations required by the DWA algorithm, DEM shufflers 35, 36 are designed as follows. Each threshold voltage input of analog DEM shuffler 35 is assignable to every $4^{th}$ comparator. For example, vth0 is assignable to vcomp0, vcomp4, vcomp8, or vcomp12, and vth5 is assignable to vcomp5, vcomp9, vcomp13, or vcomp2 etc. Each input bit of digital DEM shuffler 36 is assignable to one of 4 adjacent output bits. For example, b0 is assignable to q0, q1, q2, or q3, and b13 is assignable to q13, q14, q0, or q1 etc. By properly controlling the pair of DEM shufflers 35, 36 with appropriate control signals, data samples at the input of feedback DAC 37 can be rotated by 0 to 14 bits as desired. Rotating by 15 bits is also possible, but it is equivalent to rotating by 0 bits because there are only 15 unit-elements in feedback DAC 37.

In all three Tables I to III, the quantized DSM output values are chosen to be the same in every cycle, and the DEM pointer is set to zero in cycle 0. As stated earlier, Delta-Sigma modulators 10, 20 and 30 are logically equivalent in terms of what is received at the feedback DAC input. Therefore, the feedback DAC input and DEM pointer columns are the same in all three Tables I to III. The main difference lies in the quantizer output bit patterns and the shuffler control signals. To be clear, the sum of the number of 1's in the quantizer output is the same in all three Tables I to III, but the pattern is different due to different shuffling configurations. Incidentally, cycle number 2 is the exact case that is being used in the present example, with the DEM pointer at unit-element 9, and DSM output value equal to 7.

Since Delta-Sigma modulators 10, 20 and 30 are logically equivalent in terms of what the feedback DAC receives at its input, the only difference is how the bits controlling the

TABLE III

| cycle | DEM pointer | DSM output | Quantizer output (b14...b0) | DAC input (q14...q0) | control signals | |
|---|---|---|---|---|---|---|
| | | | | | analog shuffler | digital shuffler |
| 0 | 0 | 3 | 000000000000111 | 000000000000111 | 00 | 00 |
| 1 | 3 | 6 | 000000000111111 | 000001111111000 | 00 | 11 |
| 2 | 9 | 7 | 111111100000000 | 111111000000001 | 10 | 01 |
| 3 | 1 | 12 | 000111111111111 | 001111111111110 | 00 | 01 |
| 4 | 13 | 8 | 111000000011111 | 110000000111111 | 11 | 01 |
| 5 | 6 | 4 | 000000011110000 | 000001111000000 | 01 | 10 | analog unit-elements within the feedback DAC are being shuffled in hardware before they arrive at the input of the feedback DAC. Encompassing all three Delta-Sigma modulators 10, 20 and 30, it is assumed that each Delta-Sigma modulator is a 4-bit Delta-Sigma modulator having 15 comparators that generate a 15-bit unary quantizer output, representing 16 unique levels. Each 15-bit wide quantizer output matches a 15-bit wide feedback DAC input, while each feedback DAC input bit controls exactly one analog unit-element within the feedback DAC. All loop-filters in Delta-Sigma modulators 10, 20 and 30 are identical. Further, it is assumed that in the immediate previous modulator clock cycle, the last feedback DAC analog unit-element enabled in the rotation corresponds to feedback DAC input bit 8, meaning that in the current cycle, the first feedback DAC analog unit-element to be enabled corresponds to feedback DAC input bit 9, as dictated by the DWA algorithm. It is also assumed that the quantizer output value, i.e., the total number of 1's counted at the 15-bit quantizer output, is equal to 7 (or 0111 in binary).

Figure 3B:
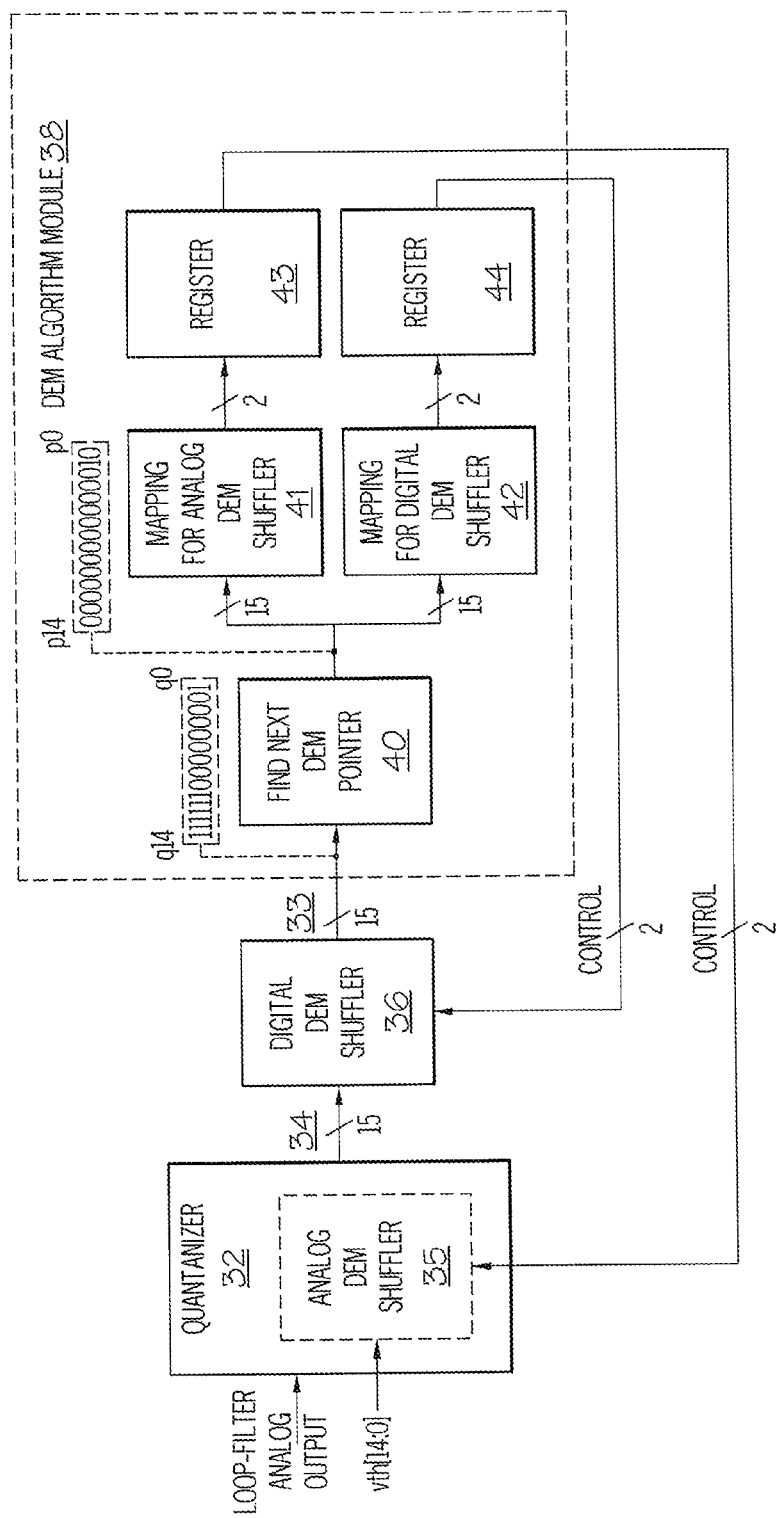
FIG. 3B is a block diagram of a DEM algorithm module within the Delta-Sigma modulator from FIG. 3.

A detailed block diagram of DEM algorithm module 38 is depicted in FIG. 3B. As shown, DEM algorithm module 38 uses shuffled input signal 33 to generate control signals for analog DEM shuffler 35 and digital DEM shuffler 36. Based on shuffled input signal 33, a find_next_DEM_pointer module 40 generates a 15-bit pattern that represents the location of the next DEM pointer. For example, if shuffled input signal 33 is equal to 111111000000001, the output of find_next_DEM_pointer module 40 is equal to 000000000000010, i.e., the "1" in the 15-bit DEM pointer bit pattern is the location of the first DAC unit-element to be enabled in the following cycle. Based on this DEM pointer bit pattern, mapping modules 41 and 42 generate controls signal for analog DEM shuffler 35 and digital DEM shuffler 36, respectively. The two separate but related control signals effectively pinpoint the same DAC unit-element pointed to by the next DEM pointer bit pattern. The control signals are saved in registers 43, 44 for one clock cycle so that they are available throughout the cycle. The logic to find the next DEM pointer involves detecting a 0 to 1 transition in shuffled input signal 33. If the output value of quantizer 32 is 0; however, the shuffled input bit pattern is all 0's with no 0 to 1 transitions. When this happens, the next DEM pointer should remain at the same position because no DAC unit-elements are enabled, and registers 43, 44 should not be updated for that cycle, so that DEM shufflers 35, 36 will automatically default to the previous cycle's shuffling combination. Similarly, if the output of quantizer 32 is 15, the shuffled input bit pattern is all 1's with no 0 to 1 transitions. When this happens, the next DEM pointer also should remain at the same position because rotating by 15 unit-elements in a 15 unit-element DAC ends up at the same unit-element again. Therefore, register 43 and 44 should not be updated for that cycle so that DEM shufflers 35, 36 will automatically default to the previous cycle's shuffling combination.

Mapping module 41 uses the DEM pointer bit pattern to generate a 2-bit control signal for analog DEM shuffler 35. Depending on where the "1" is located in the DEM pointer bit pattern, the 2-bit control signal is set correspondingly. For example, if the "1" is located at bits 0, 1, 2 or 3, mapping module 41 generates 00 to signify no rotation at all by analog DEM shuffler 35. If the "1" is located at bits 4, 5, 6 or 7, mapping module 41 generates 01 to signify a rotation by 4 bits. If the "1" is located at bits 8, 9, 10 or 11, mapping module 41 generates 10 to signify a rotation by 8 bits. If the "1" is located at bits 12, 13 or 14, mapping module 41 generates 11 to signify a rotation by 12 bits. Similarly, mapping module 42 uses the DEM pointer bit pattern to generate a 2-bit control signal for digital DEM shuffler 36. Depending on where the "1" is located in the DEM pointer bit pattern, the 2-bit control signal is set correspondingly. For example, if the "1" is located at bits 0, 4, 8 or 12, mapping module 42 generates 00 to signify no rotation at all by digital DEM shuffler 36. If the "1" is located at bits 1, 5, 9 or 13, mapping module 42 generates 01 to signify a rotation by 1 bit. If the "1" is located at bits 2, 6, 10 or 14, mapping module 42 generates 10 to signify a rotation by 2 bits. If the "1" is located at bits 3, 7 or 11, mapping module 42 generates 11 to signify a rotation by 3 bits. In other words, the sum of the rotation by analog DEM shuffler 35 and the rotation by digital DEM shuffler 36, is equal to the next DEM pointer bit location. Although the above-mentioned control signals are illustrated as binary values, a person skilled in the art will understand that unary control signals are equally valid and can be substituted. The benefit of using unary control signals is speed, because it obviates the need for encoders and decoders to convert signals to and from binary, respectively.

Figure 3C:
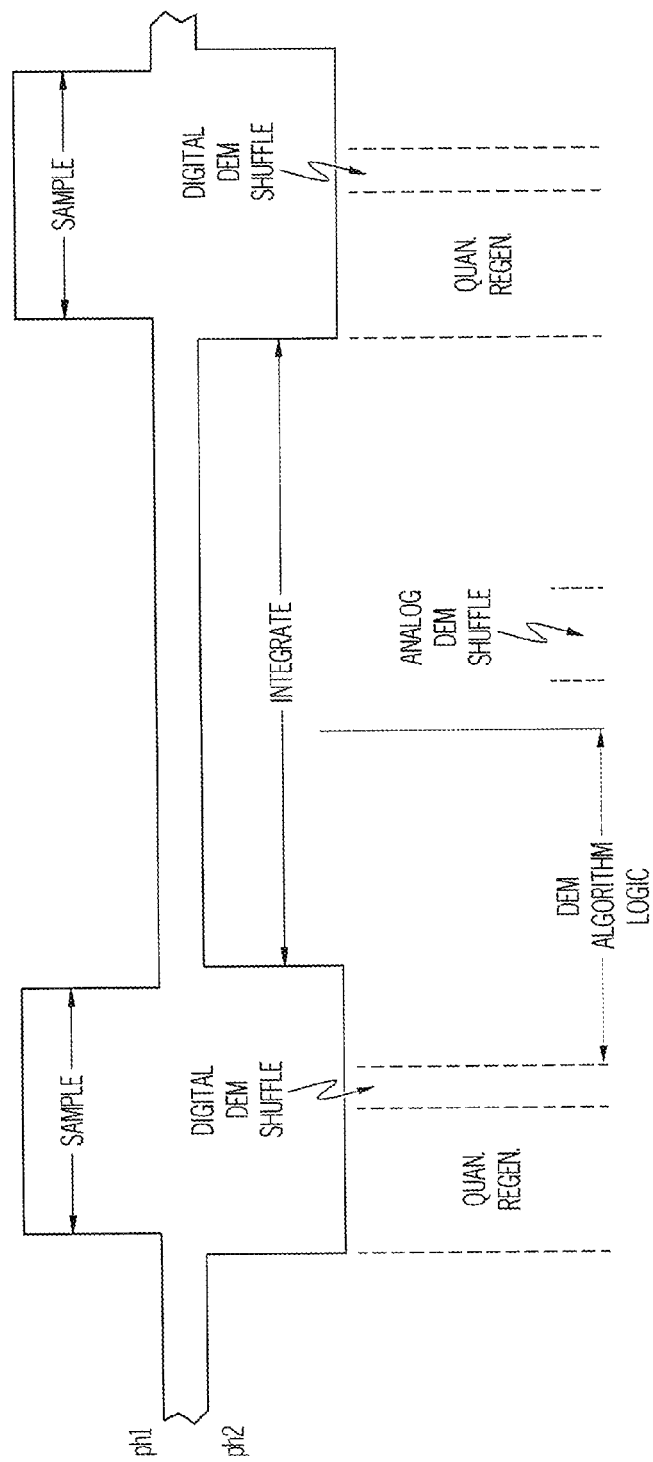
FIG. 3C is a timing diagram for the Delta-Sigma modulator from FIG. 3.

The timing diagram for Delta-Sigma modulator 30 is depicted in FIG. 3C. As shown, the propagation delay of analog DEM shuffler 35 is roughly twice as long as digital DEM shuffler 36 because analog signals need a longer time to settle. Compared to FIGS. 1B and 2B, the propagation delays of DEM shufflers 35, 36 are significantly shorter than their counterparts. This is because DEM shufflers 35, 36 that only perform partial shuffling have significantly lower complexity, which usually lead to significantly lower latency. Timing requirements here are the same as in FIGS. 1B and 2B, i.e., digital DEM shuffler 36 must finish shuffling before the rising edge of ph2, and analog DEM shuffler 35 must finish shuffling before quantizer regeneration begins The total propagation delay of quantizer regeneration, DEM algorithm computation, and analog DEM shuffling must be shorter than one clock cycle. With shorter DEM shuffling latency for DEM shufflers 35, 36, higher sampling rates can be achieved, assuming the sampling rate is not limited by something else.

As has been described, the present invention provides an improved Delta-Sigma modulator having analog and digital DEM shufflers. Although the present invention is explained using barrel shifters, it is understood that logarithmic shifters can be used instead. Logarithmic shifters have the benefit of slower complexity growth, but a signal must propagate through M switch nodes in order to arrive at the DEM shuffler's output, with each node contributing propagation delay (a barrel shifter has only a single switch node for each interconnect). Forcing a signal to pass through a series of switch nodes in a DEM shuffler can be a serious speed limitation for high-speed designs. In practice, the choice between a barrel shifter and a logarithmic shifter depends on specific situations. When high quantizer resolution and maximum speed are demanded, neither is a clear winner. The present invention provides a method to increase the resolution of the quantizer without having to reduce the ADC sampling rate. This is desirable because every single bit increase in quantizer resolution lowers the quantization noise floor by 6 dB, allowing the ADC to achieve higher resolution while maintaining maximum speed.

DWA algorithm is used to explain the salient features of the present invention. It should be understood by those skilled in the art that the present invention is also applicable to other DEM algorithms, such as second-order DEM, advancing DWA, etc.

While the invention has been particularly shown and described with reference to a preferred embodiment, it will be understood by those skilled in the art that various changes in form and detail may be made therein without departing from the spirit and scope of the invention.

What is claimed is:

1. A data converter comprising:
   a loop-filter for receiving analog signals;
   a quantizer for converting filtered analog signals from said loop-filter to digital signals;
   an analog dynamic element matching (DEM) shuffler for performing a first round of shuffling on a plurality of analog threshold levels feeding said quantizer to yield a set of partially shuffled digital data at an output of said quantizer;
   a digital DEM shuffler for performing a second round of shuffling on said set of partially shuffled digital data from said output of said quantizer to yield a fully shuffled set of digital data; and
   a feedback digital-to-analog converter (DAC) having a plurality of analog unit-elements for converting said fully shuffled set of digital data to a set of analog data to be combined with an analog input of said data converter to serve as inputs to said loop-filter,
   wherein said shuffling in said first and second rounds required to achieve proper shaping of mismatch energy of said plurality of analog unit-elements in said feedback DAC is divided between said analog DEM shuffler and said digital DEM shuffler accordingly,
   wherein said analog DEM shuffler and said digital DEM shuffler both contribute to achieve proper shaping of said mismatch energy of said plurality of analog unit-elements in said feedback DAC.

2. The data converter of claim 1, wherein said data converter further includes a DEM algorithm module for generating a first set of control signals to control said analog DEM shuffler, and a second set of control signals to control said digital DEM shuffler.

3. The data converter of claim wherein said DEM algorithm module includes
   a pointer module for locating a next DEM pointer;
   a mapping module for providing mapping for said analog DEM shuffler; and
   a register for storing said mapping information.

4. The data converter of claim 3, wherein said DEM, algorithm module further includes
   a second mapping module for providing mapping for said digital DEM shuffler; and
   a register for storing said mapping information.

5. The data converter of claim 1, wherein said data converter further includes a 1's counter for counting the number of logical 1's in a set of output data of said quantizer.

6. The data converter of claim 1, wherein said analog DEM shuffler is integrated within said quantizer.

7. The data converter of claim 1, wherein said analog unit-elements include switched capacitors.

8. The data converter of claim 1, wherein said analog unit-elements include current sources.

9. The data converter of claim 1, wherein said analog DEM shuffler includes a plurality of multiplexers.

10. The data converter of claim 9, wherein said digital DEM shuffler includes a plurality of multiplexers.

11. A method comprising:
    receiving a plurality of analog signals from an analog input of a loop-filter;
    converting filtered analog signals to digital signals by a quantizer;
    performing a first round of shuffling on a plurality of analog threshold levels feeding said quantizer by an analog dynamic element matching (DEM) shuffler to yield a set of partially shuffled digital data at an output of said quantizer;
    performing a second round of shuffling on said set of partially shuffled digital data from said output of said quantizer by a digital DEM shuffler to yield a fully shuffled set of digital data; and
    converting said fully shuffled set of digital data by a feedback digital-to-analog converter (DAC) having a plurality of analog unit-elements to a set of analog data to be combined with an analog input of data converter to serve as inputs to said loop-filter, wherein said shuffling in said first and second rounds required to achieve proper shaping of mismatch energy of said plurality of analog unit-elements in said feedback DAC is divided between said analog, DEM shuffler and said digital DEM shuffler accordingly, wherein said analog DEM shuffler and said digital DEM shuffler both contribute to achieve proper shaping of said mismatch energy of said plurality of analog unit-elements in said feedback DAC.

12. The method of claim 11, wherein said method further includes
    generating a first set of control signals for said analog DEM shuffler, and
    generating a second set of control signals for said digital DEM shuffler.

* * * * *